(12) United States Patent
Ito et al.

(10) Patent No.: US 8,896,199 B2
(45) Date of Patent: Nov. 25, 2014

(54) LIGHT-EMITTING DEVICE HAVING FLUORESCENT SUBSTANCE PARTICLES AND SPACER PARTICLES, AND METHOD FOR MANUFACTURING THE SAME

(75) Inventors: Kosaburo Ito, Tokyo (JP); Toshihiro Seko, Tokyo (JP); Kazuhiko Ueno, Tokyo (JP); Naoto Suzuki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 117 days.

(21) Appl. No.: 13/567,031

(22) Filed: Aug. 4, 2012

(65) Prior Publication Data
US 2013/0033169 A1 Feb. 7, 2013

(30) Foreign Application Priority Data
Aug. 5, 2011 (JP) .................. 2011-172274

(51) Int. Cl.
*H01J 1/62* (2006.01)
*H01J 9/00* (2006.01)
*H01L 33/54* (2010.01)
*H01L 33/50* (2010.01)
*H01L 33/60* (2010.01)

(52) U.S. Cl.
CPC ............... *H01L 33/505* (2013.01); *H01L 33/60* (2013.01); *H01L 33/54* (2013.01)
USPC ............................. 313/502; 313/512; 445/58

(58) Field of Classification Search
CPC ... H01J 2211/42; H01L 33/56; H01L 33/502; H01L 33/58; B29C 67/08; C09K 11/02; C09K 11/7774; C08L 63/00
USPC ................................. 313/498, 512; 257/40, 98
See application file for complete search history.

(56) References Cited

U.S. PATENT DOCUMENTS

2003/0230751 A1 * 12/2003 Harada .......................... 257/80
2005/0127385 A1 6/2005 Reeh et al.

FOREIGN PATENT DOCUMENTS

JP 2004-31989 A 1/2004
JP 2009-218274 A 9/2009

OTHER PUBLICATIONS

Harada et al. "Japanese Patent Application Publication 2009-218274,Sep. 2009, machine translation.*

* cited by examiner

*Primary Examiner* — Tracie Y Green
(74) *Attorney, Agent, or Firm* — Kenealy Vaidya LLP

(57) ABSTRACT

There is provided a method for producing a light emitting device having a small light emitting area and showing high light extraction efficiency. An uncured resin 13' is dropped on either one or both of a light emitting element 11 and a tabular member 14 in such an amount that the resin is maintained on them by surface tension, the light emitting element 11 and the tabular member 14 are piled up with the uncured resin 13' maintained between them and on a side of the light emitting element by surface tension of the uncured resin 13' to form an uncured resin layer 13' having an inclined side 130, and then the resin layer 13 is cured. The tabular member is constituted with a material having an alkali metal oxide content of 0.2% by weight or lower.

8 Claims, 13 Drawing Sheets

Filled up type (a)

Cylindrical type (b)

(a)

(b)

(c)

LIGHT-EMITTING DEVICE HAVING FLUORESCENT SUBSTANCE PARTICLES AND SPACER PARTICLES, AND METHOD FOR MANUFACTURING THE SAME

This application claims the priority benefit under 35 U.S.C. §119 of Japanese Patent Application No. 2011-172274 filed on Aug. 5, 2011, which is hereby incorporated in its entirety by reference.

TECHNICAL FIELD

The presently disclosed subject matter relates to a light emitting device that converts light from a light emitting element with a wavelength conversion layer, and a method for manufacturing the same.

BACKGROUND ART

There are known light emitting devices that convert a part of light from a light emitting element into light of a different wavelength, mix the converted light and the light from the light emitting element and emit the mixed light. As configurations of such light emitting devices using a fluorescent substance-containing layer, there are known structures in which a light emitting element is disposed in a cup, and the cup is filled with a fluorescent substance-containing resin, or only the opening of the cup is covered with a fluorescent substance-containing resin layer, as described in Patent document 1. Further, there is also disclosed a structure in which circumference of a light emitting element is coated with a fluorescent substance-containing resin layer.

In optical devices in which light emitted from a light emitting device (light source) is controlled with an optical system such as lens or reflector, in order to effectively use the light with a small optical system, it is desirable to use a light emitting device (light source) having a small light emitting area.

Patent document 2 discloses a structure in which a wavelength conversion layer is carried on an upper surface of a light emitting element, and sides of the light emitting element and the wavelength conversion layer are covered with a reflection member. By covering the sides of the light emitting element and the wavelength conversion layer with a reflection member, light which is to be emitted in the direction of the sides of the light emitting element and the wavelength conversion layer can be reflected at the sides, and emitted from the upper surface, and therefore luminance for the front direction can be improved.

PRIOR ART REFERENCES

Patent Documents

Patent document 1: Japanese Patent Unexamined Publication (KOKAI) No. 2004-31989
Patent document 2: Japanese Patent Unexamined Publication No. 2009-218274

SUMMARY

Although such a structure as disclosed in Patent document 1 in which a light emitting element is disposed in a cavity such as cup or recess, and the outgoing light of the light emitting element is reflected by an inclined internal surface of the cavity serving as a reflector surface can improve the external efficiency of the light for the upward direction, the light emitting surface is defined by the opening of the cavity. The size of the opening is determined by the inclination of the internal surface of the cavity. However, the minimum size of the cavity such as cup or recess that can be processed to have a desired shape of internal surface is limited, and the size of the opening (light emitting surface) is necessarily becomes larger than the upper surface of the light emitting element. There is also a problem that, since the light penetrates through the fluorescent substance-containing resin layer or a sealing material from the light emitting element to the internal surface of the cavity, the light is decayed.

In the configuration disclosed in Patent document 2 in which a reflection member is disposed as a vertical wall with respect to the sides of the light emitting element and the wavelength conversion layer, the light emitted from the element or the wavelength conversion layer is reflected by the reflection member to make the light emitting surface small, and thereby improve the front luminance. However, the light reflected by the reflection member at the side of the light emitting element is returned to the inside of the light emitting element, and the absorption band of the light emitting element includes the wavelength of the reflected light. Therefore, there arises a problem that, the ratio of reflection and absorption of the transversely propagated light emitted from the side increases, and thus the amount of total light flux decreases.

An aspect of the presently disclosed subject matter is to provide a method for producing a light emitting device having a small light emitting area and showing high light extraction efficiency.

According to a first embodiment of the presently disclosed subject matter, there is provided the following light emitting device. That is, the light emitting device comprises a substrate, a light emitting element mounted on the substrate, a resin layer disposed on the light emitting element and comprising a resin through which light emitted by the light emitting element can penetrate as a base material, and a tabular member disposed on the resin layer. The lower surface of the tabular member is larger than the upper surface of the light emitting element, and the resin layer forms a slope connecting a lower end of a side of the light emitting element and a side of the tabular member. The tabular member is constituted with a material having an alkali metal oxide content of 0.2% by weight or lower.

According to the second embodiment of the presently disclosed subject matter, there is provided the following light emitting device. That is, the light emitting device comprises a substrate, a light emitting element mounted on the substrate, a resin layer disposed on the light emitting element and comprising a resin through which light emitted by the light emitting element can penetrate as a base material, and a tabular member disposed on the resin layer. The resin layer contains fluorescent substance particles and spacer particles having a particle size larger than that of the fluorescent substance particles and locating between the light emitting element and the tabular member to define thickness of the resin layer. The spacer particles are constituted with a material having an alkali metal oxide content of 0.2% by weight or lower.

As the material having an alkali metal oxide content of 0.2% by weight or lower used in the first embodiment and the second embodiment, for example, alkali-free glass or a material comprising at least one of $SiO_2$ and $Al_2O_3$ as a main component at a purity of 99.9% or higher.

According to the presently disclosed subject matter, light emitted from the side of the light emitting element is not returned to the inside of the light emitting element, but can be reflected by a slope of a reflection material layer, and therefore the light extraction efficiency is improved. Since the light emitting surface is the upper surface of the tabular member, the device can be made in a smaller size. Moreover, since oil bleeding from the resin layer can be prevented, degradation of optical characteristics can be suppressed.

Hereafter, light emitting devices as embodiments of the presently disclosed subject matter will be explained.

EMBODIMENT 1

Figure 1:
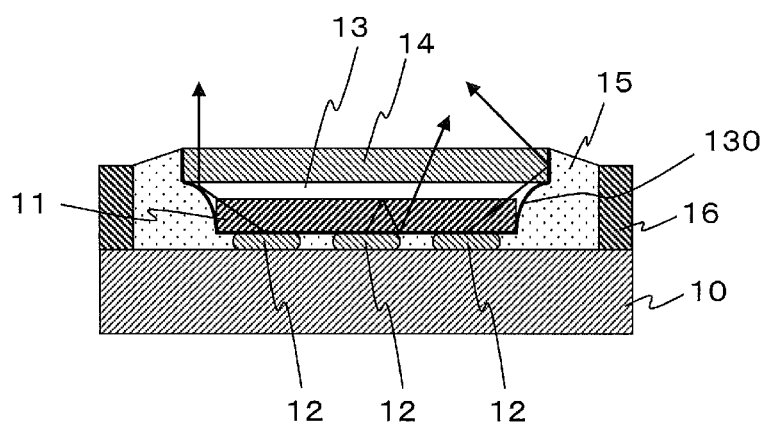
FIG. 1 is a sectional view of a light emitting device according to Embodiment 1.

A sectional view of a light emitting device according to Embodiment 1 is shown in FIG. 1. This light emitting device has a reflection surface (slope) 130 for light extraction at a position near a side of a light emitting element 11.

Specifically, on a submount substrate 10 on which upper surface wiring is formed, a flip chip type light emitting element 11 is mounted by bonding with a plurality of bumps 12. On the upper surface of the light emitting element 11, a resin layer 13 transparent for light emitted by the light emitting element 11 is disposed, and a tabular member 14 having a wavelength conversion function is disposed thereon.

A frame 16 is disposed outside the light emitting element 11, and the space between the light emitting element 11 and the frame 16 is filled with a reflection material layer 15. For the reflection material layer 15, a non-conductive material showing a high reflection rate is used. The reflection material layer 15 covers outer circumferences of sides of the light emitting element 11, the resin layer 13, and the tabular member 14. Further, the reflection material layer 15 also fills the space between the bottom surface of the light emitting element 11 and the upper surface of the substrate 10 so as to fill the spaces between the bumps 12.

The size of the tabular member 14 for the main plane direction is slightly larger than that of the light emitting element 11, and the slope 130 formed at the boundary between the reflection material layer 15 and the resin layer 13 serves as a reflection surface for reflecting the light outgoing to the direction of the sides of the light emitting element 11 and the tabular member 14. Since the reflection material layer 15 is in contact with the side of the tabular member 14, the size of the opening of the reflection material layer 15 (light emitting surface) is equal to the area of the tabular member 14, and thus a light source having a small light emitting area can be provided.

Figure 2:
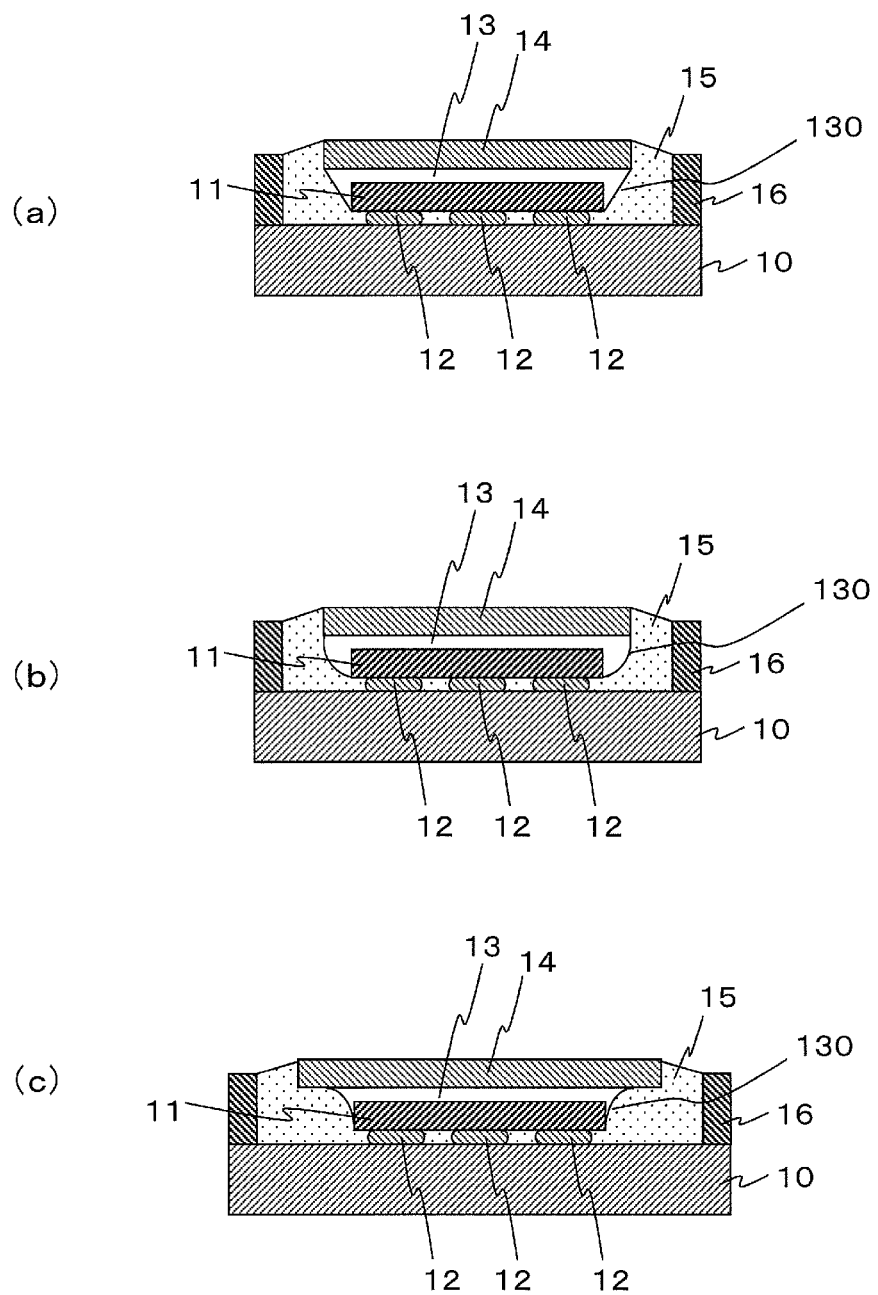
FIG. 2 includes sectional views of light emitting devices according to Embodiment 1 for the cases where the slope 130 of the reflection material layer 15 of the light emitting device has (a) a flat surface, (b) a curved surface convex to the outside, and (c) a curved surface convex to the inside.

The slope 130 at the boundary between the reflection material layer 15 and the resin layer 13 can be formed as a slope linearly connecting the bottom surface of the light emitting element 11 and the lower surface of the tabular member 14 as shown in as shown in FIG. 2, (a), a curved surface convex to the outside (side of the frame 16) as shown in FIG. 2, (b), or a curved surface convex to the inside (side of the center of the light emitting element 11) as shown in FIG. 2, (c). In this embodiment, in order to improve light emission efficiency for the upward direction, such a flat slope as shown in FIG. 2, (a) and such a curved surface convex to the inside as shown in FIG. 2, (c). The curved surface can be convex to the inside as shown in FIG. 2, (c) having a curvature of 5 or smaller.

Further, one end of the slope 130 on the side of the light emitting element 11 does not necessarily need to be in the same height as the bottom surface of the light emitting element 11 as shown in FIG. 2, (a) to (c), and may be at a height within the side of the light emitting element 11. If one end of the slope 130 on the side of the light emitting element 11 is at a position on the side of the substrate 10 with respect to the upper surface of the light emitting element 11, it can serve as the slope 130 that reflects light emitted from the side of the light emitting element 11. Further, the light emitting element 11 can be flip chip mounted on the substrate 10. This is because, if it is flip chip mounted, the light emitting surface locates at a position near the bottom surface of the light emitting element, and therefore reflection by the slope 130 can be utilized at maximum.

As the submount substrate 10, for example, a substrate made from AlN ceramics on which a wiring pattern is formed with Au or the like is used. As the bump 12, for example, Au bump is used.

As the light emitting element 11, one that emits light of a desired wavelength is prepared. For example, one that emits blue light is used.

The tabular member 14 has a function of converting the light from the light emitting element 11 into light of a desired wavelength, and is constituted with, for example, a material containing a fluorescent substance that emits fluorescence of a desired wavelength using the light from the light emitting element 11 as an excitation light. For example, a layer comprising a transparent resin in which a fluorescent substance is dispersed, a fluorescent glass plate containing a fluorescent substance component, and a fluorescent ceramic plate formed by sintering a raw material of a fluorescent substance (for example, YAG plate) can be used. Specifically, for example, a tabular member 14 containing a fluorescent substance that is excited with light emitted by the light emitting element 11 that emits blue light to emit yellow fluorescence (for example, YAG fluorescent substance etc.) is used. A light emitting device that emits white light as mixture of blue light and yellow light can be thereby provided.

The tabular member 14 preferably has an alkali metal oxide content of 0.2% by weight or lower, particularly preferably 0.1% by weight or lower.

For the resin layer 13, a material transparent for the light emitted by the light emitting element 11 and the light obtained by conversion with the tabular member 14 is used. For example, such a transparent resin as a silicone resin or an epoxy resin to which a filler having a particle size of 0.001 to 50 μm is added is used.

It is preferred that the filler has an alkali metal oxide content of 0.2% by weight or lower, particularly preferably 0.1% by weight or lower. Further, it is desirable that it consists of a material not showing photocatalytic property. For example, an alkali-free glass filler or a filler consisting of either one of $SiO_2$ and $Al_2O_3$ or a combination thereof is used. It is preferred that the alkali-free glass has an alkali metal oxide content of 0.2% by weight or lower, particularly preferably 0.1% by weight or lower. It is preferred that $SiO_2$ and $Al_2O_3$ have a purity of 99.9% or higher. As for crystal structure of the filler, it may be an amorphous material, or a polycrystal or single crystal material may also be used for securing improved purity and reduced alkali metal oxide content.

By using a material having an alkali metal oxide content of 0.2% by weight or lower is used as the tabular member 14 and the filler of the resin layer 13 as described above, oil bleeding from the base material resin of the resin layer 13 (silicone resin, epoxy resin, etc.) due to alkali metal oxide contained in the tabular member 14 or the filler can be prevented. That is, the oil bleeding phenomenon, that is, a phenomenon that the base material resin of the resin layer 13 is partially decomposed with an alkali component contained in the filler into lower molecules to generate oily substances, and these substances bleed from the resin layer 13, can be prevented. Such phenomena as unevenness at the interface of the resin layer 13 and the tabular member 14 to be formed by the oil that bled, or degradation of the optical characteristics to be induced by oil that creeps up the surface of the tabular member 14 can be thereby prevented.

As the reflection material layer 15, for example, a resin in which a reflective filler such as those of titanium oxide or zinc oxide is dispersed is used. It is also preferable to use, as the titanium oxide or zinc oxide filler, a filler having an alkali metal oxide content of 0.2% by weight or lower and a structure not showing photocatalytic property. This is for not inducing the oil bleeding from the base resins of the reflection material layer 15 and the resin layer 13.

For the frame 16, for example, a ceramic ring is used.

In the light emitting device of such a configuration as described above, of the light emitted by the light emitting element 11, the light emitted upward penetrates through the resin layer 13, and enters into the tabular member 14, as shown in FIG. 1. The light emitted downward is reflected by the reflection material layer 15 at the bottom surface of the light emitting element 11, and goes upward.

By filling the space between the bottom surface of the light emitting element 11 and the upper surface of the substrate 10 with the reflection material layer 15 so that the layer surrounds the bumps 12, the light emitted to the side of the lower surface of the light emitting element 11 can be reflected with the reflection material layer 15, and emitted upward. Accordingly, decay of the light induced by repetitive reflections between the bottom surface of the light emitting element 11 and the upper surface of the substrate 10 can be prevented, and therefore the light extraction efficiency for the upward direction can be improved.

The light emitted from the side of the light emitting element 11 enters into the resin layer 13 from the side, and is reflected upward by the slope 130 at the boundary between the reflection material layer 15 and the resin layer 13. Thus, much of the light emitted from the side of the light emitting element 11 is not returned to the inside of the light emitting element 11, and therefore it is not absorbed by the light emitting element 11. Further, since the distance from the side of the light emitting element 11 to the reflection material layer 15 is short, absorption by the resin layer 13 hardly influences, either.

As described above, the light emitted from the light emitting element 11 directly enters into the tabular member 14, or reflected by the slope 130 and then enters into the tabular member 14. A part or whole of the light that entered into the tabular member 14 is converted into light of a predetermined wavelength, and emitted from the upper surface of the tabular member 14. The light that advances in the transverse direction from the inside of the tabular member 14 is reflected by the slope 130 at the side, returned into the tabular member 14, and emitted from the upper surface.

Accordingly, the light emitting surface of the light emitting device according to this embodiment is the upper surface of the tabular member 14 (opening of the reflection material layer 15), and therefore a small size light emitting device having a small light emitting area is provided. Further, since a cavity is formed with the reflection material layer 15 in spite of the small diameter, much of the light emitted from the side of the light emitting element 11 is not returned into the inside of the light emitting element 11, but penetrates through the resin layer 13 for only a short distance, and then it is reflected by the reflection material layer 15, and goes upward. Therefore, the light extraction efficiency is improved.

Further, since a material having an alkali metal oxide content of 0.2% by weight or lower is used as the tabular member 14 and the filler of the resin layer 13, oil bleeding hardly occurs from the resin layer 13, and thus the optical characteristics are not easily degraded during light emission for a long period of time or light emission in a large amount of light.

Figure 3:
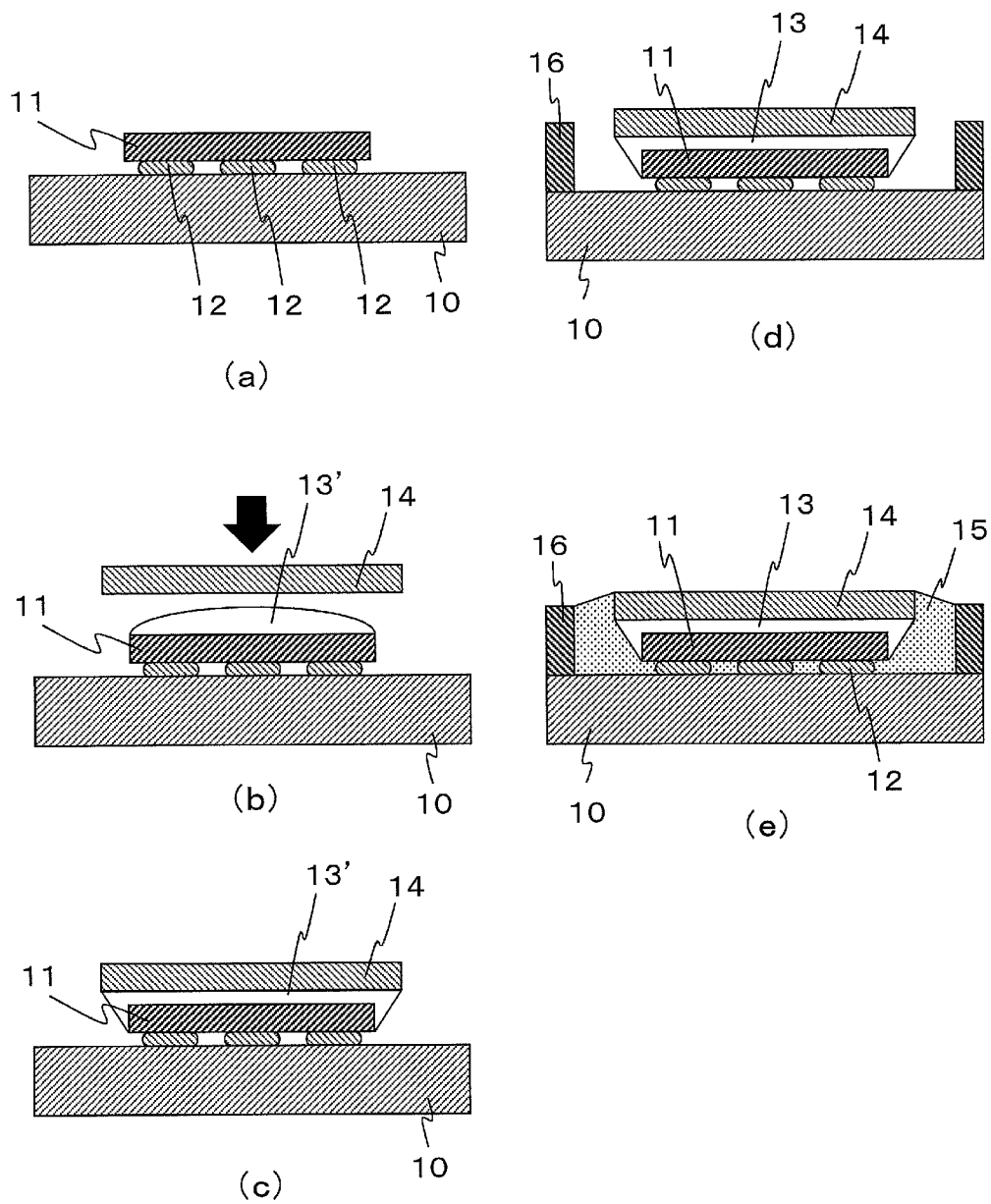
FIGS. 3, (a) to (e) are explanatory drawings showing the production process of the light emitting device according to Embodiment 1.

Hereafter, the method for producing the light emitting device of this embodiment will be explained with reference to FIG. 3, (a) to (e). First, as shown in FIG. 3, (a), element electrodes of the light emitting element 11 of the flip chip type are bonded to the wiring pattern on the upper surface of the submount substrate 10 by using the bumps 12 to mount the element on the substrate. As shown in FIG. 3, (b), a resin 13' (uncured) such as a silicone resin is applied (dropped) to the upper surface of the light emitting element 11, and the tabular member 14 of a size slightly larger than the upper surface of the light emitting element 11 is disposed. As a result, the uncured resin 13' covers at least a part of the side of the light emitting element and is maintained between the light emitting element and the tabular member by surface tension, and thus the slope 130 connecting the side of the light emitting element 11 and the lower surface of the tabular member 14 is formed, as shown in FIG. 3, (c).

In the above step, if the amount of the resin 13' is small, the slope 130 is formed in the shape of a curved surface convex to the side of the light emitting element 11 as shown in FIG. 2, (c), if the amount of the resin 13' is increased, the slope 130 in the shape of a flat surface is formed as shown in FIG. 2, (a) and FIG. 3, (c), and if the amount of the resin 13' is further increased, the slope 130 in the shape of a curved surface convex to the outside is formed as shown in FIG. 2, (b).

The resin 13' is cured by a predetermined curing treatment to form the resin layer 13. So long as the shape of the resin layer 13 does not change in the following steps, it may not be completely cured, but it may be cured under a condition for semi-curing the resin.

Then, as shown in FIG. 3, (d), the frame 16 is adhered to the upper surface of the substrate 10 with a resin or the like outside the light emitting element 11. As shown in FIG. 3, (e), into the space between the light emitting element 11, the resin layer 13 and the tabular member 14, and the frame 16, the reflection material (uncured) is injected with a dispenser or the like. This injection is performed so that the reflection material is sufficiently filled also around the bumps 12 under the light emitting element 11. Further, the reflection material is filled so that the reflection material (uncured) closely contacts with the slope 130 of the resin layer 13 and the side of the tabular member without any gap. The reflection material layer 15 of a shape corresponding to the slope 130 of the resin layer 13 can be thereby formed. Finally, the reflection material is cured by a predetermined curing treatment to form the reflection material layer 15. Through the above process, the light emitting device of this embodiment is produced.

According to this embodiment, since the slope 130 of the resin layer 13 is formed beforehand utilizing the surface tension of the uncured resin, the slope 130 of the reflection material layer 15 of a desired shape can be formed, and the reflection material layer 15 can be closely adhered to the side of the tabular member 14, only by filling the circumferential spaces of the resin layer 13 and the tabular member with the reflection material layer 15. A slope (cavity) of a desired shape can be thereby produced with a small opening without requiring any machining.

Further, in this production method, when the reflection material is filled, the reflection material can also be filled into the space between the bottom surface of the light emitting element 11 and the submount substrate 10. Therefore, decay of the light under the light emitting element 11 can be prevented, decay of the light induced by absorption of the returned light by the light emitting element at the side of the light emitting element 11 can be prevented, and thus the light extraction efficiency can be improved. Further, since the light emitting surface (opening) is small, light can be controlled with less loss with a small optical system.

Furthermore, by adjusting the amount of the resin 13' to be applied, the shape of the slope 130 of the reflection material layer 15 can be changed.

Figure 4:
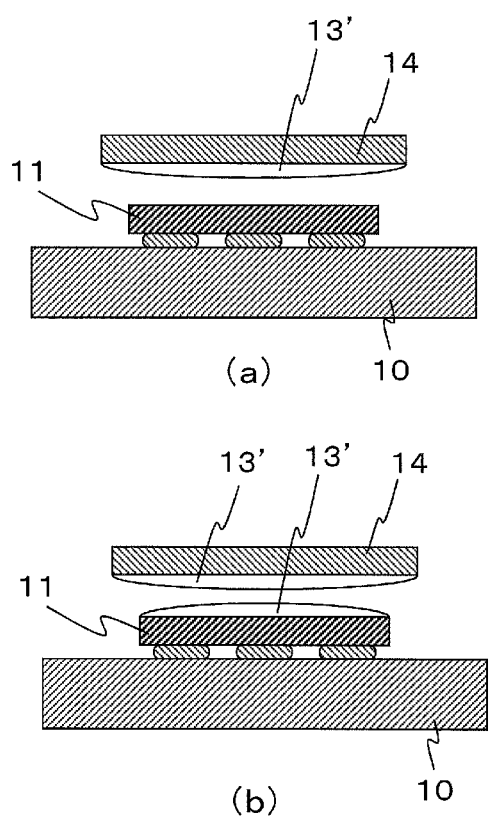
FIGS. 4, (a) and (b) are sectional views showing variations of the position at which the transparent material 13' is applied in the step shown in FIG. 3, (b).
Figure 5:
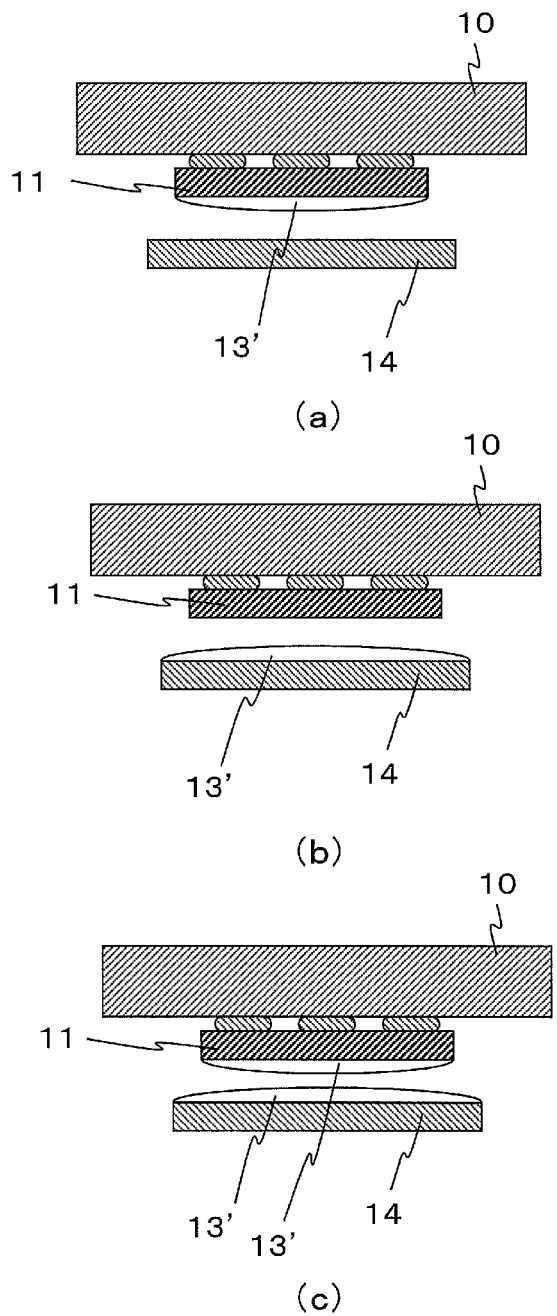
FIGS. 5, (a) to (c) are sectional views showing variations of the position at which the transparent material 13' is applied in the step shown in FIG. 3, (b), in which the light emitting element 11 is facing down.

In the explanation of the above-mentioned production method, although the uncured resin 13' is applied to the upper surface of the light emitting element 11 in the step shown in FIG. 3, (b), the production method according to this embodiment is not limited to such a method. For example, it is also possible to apply the resin 13' to the lower surface of the tabular member 14, as shown in FIG. 4, (a), and it is also possible to apply the resin 13' to both the upper surface of the light emitting element 11 and the lower surface of the tabular member 14, as shown in FIG. 4, (b). Further, as shown in FIG. 5, (a) to (c), the light emitting element 11 mounted on the submount substrate 10 may be positioned so as to face downward, and the resin 13' may be applied to the lower surface of the light emitting element 11 as shown in FIG. 5, (a), the upper surface of the tabular member 14 as shown in FIG. 5, (b), or both the lower surface of the light emitting element 11 and the upper surface of the tabular member 14 as shown in FIG. 5, (c).

It is desirable that the slope 130 of the resin layer 13 is convex to the side of the light emitting element 11, and has a curvature of 5 or smaller.

In the above explanation of Embodiment 1, a configuration that the light is reflected by the slope 130 as the interface of the reflection material layer 15 and the resin layer 13 is employed. However, it is also possible to use a configuration that the reflection material layer 15 is not used. Also in this case, light can be reflected at the interface of the resin layer 13 and air, and therefore the same effect for reflecting the light as that of Embodiment 1 can be obtained.

EMBODIMENT 2

Hereafter, as Embodiment 2, a light emitting device carrying a plurality of light emitting elements 11 on one submount substrate 10 will be explained. Sectional views of light emitting devices according to Embodiment 2 are shown in FIGS. 6, (a), (b), and (c).

A plurality of light emitting elements 11 are covered with one tabular member 14. The reflection material layer 15 surrounding the plurality of the light emitting elements 11 is disposed. The slope 130 as the side of the resin layer 13 can be a slope linearly connecting the bottom surface of the light emitting element 11 and the lower surface of the tabular member 14, or can be a slope in the shape of a curved surface convex to the side of the light emitting element 11 as shown in FIG. 6, (a) to (c). In particular, the slope can be in the shape of such a convex curved surface having a curvature of 5 or smaller.

Figure 6:
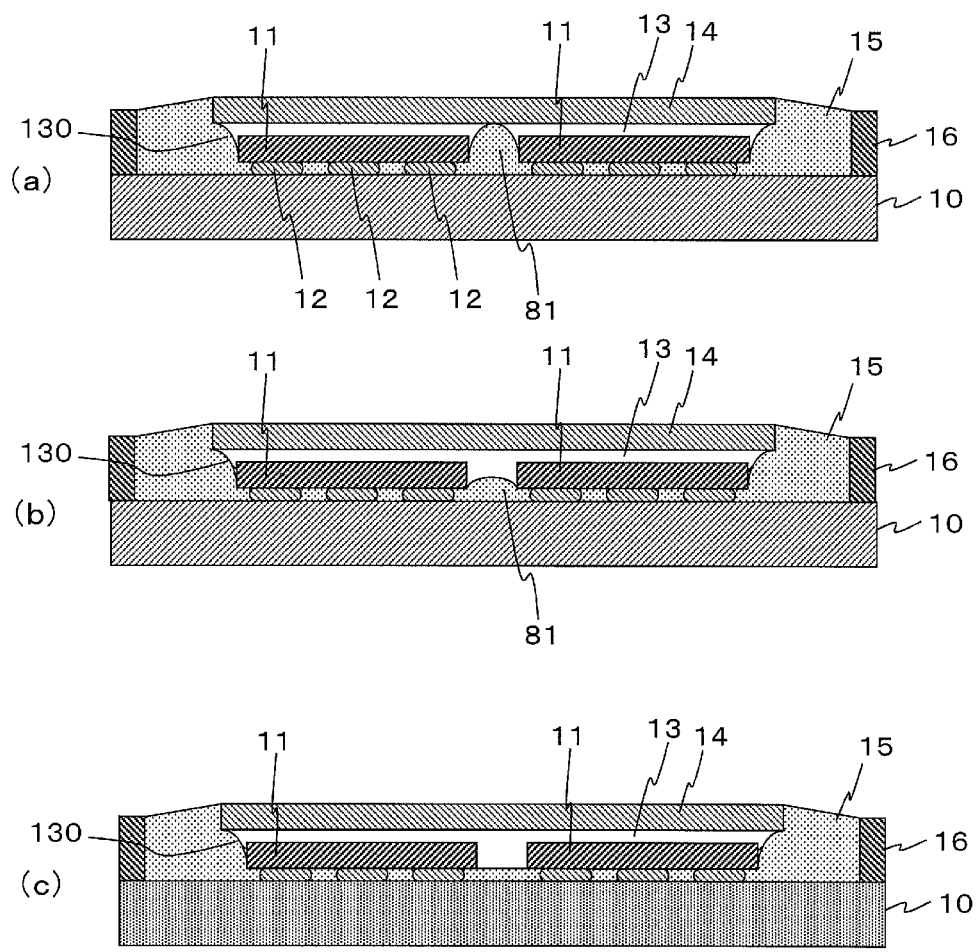
FIGS. 6, (a) to (c) are sectional views showing various shapes of the light emitting devices carrying a plurality of light emitting elements according to Embodiment 2.

The resin layer 13 may have a curved surface convex toward the tabular member 14 in the regions between the plurality of the light emitting elements 11 as shown in FIG. 6, (a) and (b). The reflection material layer 15 is filled in the shape of a convex 81 corresponding to the curved surface. By using such a shape of a curved surface convex toward the tabular member 14 as the shape of the surface of the resin layer 13 in the regions between the plurality of the light emitting elements 11, unevenness of luminance in the regions between the plurality of light emitting elements 11 can be prevented.

The upper part of the convex 81 of the reflection material layer 15 may reach the tabular member 14 as shown in FIG. 6, (a), but it is preferred that it is in such a shape not reaching the tabular member 14 as shown in FIG. 6, (b).

The side of the convex 81 can have a shape convex to the side of the light emitting element 11 and a curvature of 5 or smaller, similar to the slope 130.

The reflection material layer 15 can fill a gap between the lower surface of each light emitting element 11 and the upper surface of the submount substrate 10.

Since the other configurations can be the same as those of the first embodiment, explanation is omitted.

The methods for producing the light emitting devices shown in FIG. 6, (a) to (c) are similar to that shown in FIG. 3, (a) to (e) for Embodiment 1. However, in the case of the configuration shown in FIG. 6, (a), an equal amount of the resin 13' is applied to each light emitting element 11, a region on the tabular member 14 corresponding to each of the light emitting elements 11, or both of these to form the slope 130 of the resin layer 13 on each light emitting element 11 so that it should have a desired shape. In such a case where the resin layers 13 above adjacent light emitting elements 11 are connected in the region between the adjacent light emitting elements 11 as shown in FIGS. 6, (b) and (c), the amount of the resin 13' to be applied to each light emitting element 11 may be changed so that the total application amount of the resin 13' becomes a predetermined amount.

Specifically, in the case of filling the resin 13' as shown in FIG. 6, (a), the amount of the resin 13' is controlled so that, when the light emitting elements 11 and the tabular member 14 are piled up with the resin 13' between them, the surface of the resin 13' contacts with the tabular member 14, and the resin 13' forms inclined sides in the regions between a plurality of the light emitting elements 11. In the case shown in FIG. 6, (b), the amount of the resin 13' is controlled so that portions of the resin 13' on the adjacent light emitting elements 11 are connected with each other, and the surface of the resin 13' forms a curved surface convex toward the tabular member 14 in the regions between a plurality of the light emitting elements 11. In the case of FIG. 6 (a), a space not filled with the resin 13' can be thereby formed between the adjacent light emitting elements 11. Then, the resin 13' is cured.

Further, in the step of filling the reflection material layer 15 shown in FIG. 3, (e), in order to heap up the reflection material layer 15 in the shape of the convex 81 between a plurality of light emitting elements 11 as shown in FIGS. 6, (a) and (b), viscosity of the uncured reflection material is adjusted beforehand.

Although the light emitting device according to Embodiment 2 has the configuration of carrying a plurality of the light emitting elements 11, the slope 130 can be formed in the shape of a desired curved surface at a position near the light emitting element 11, and therefore the extraction efficiency for the upward direction can be improved. Further, the light emitting area is equal to the area of the tabular member 14, and thus a small light emitting device can be provided.

Furthermore, by using a curved surface convex toward the tabular member for the surface of the resin layer 13 in the regions between a plurality of the light emitting elements 11 as shown in FIGS. 6, (a) and (b), reduction of luminance between the plurality of the light emitting elements 11, which results in unevenness of luminance in the light emitting surface, can be prevented.

Figure 7:
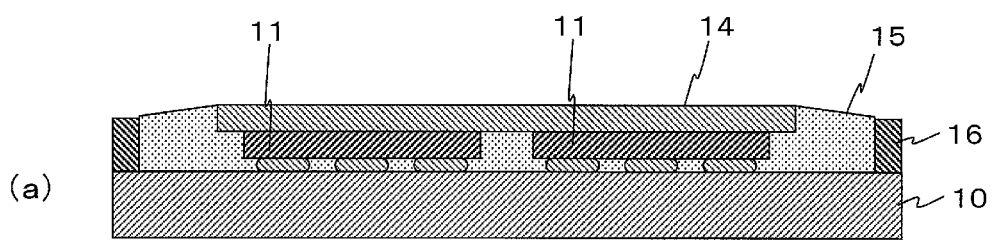
FIGS. 7, (a) and (b) are sectional views showing shapes of light emitting devices carrying a plurality of light emitting elements as comparative examples.
Figure 7:
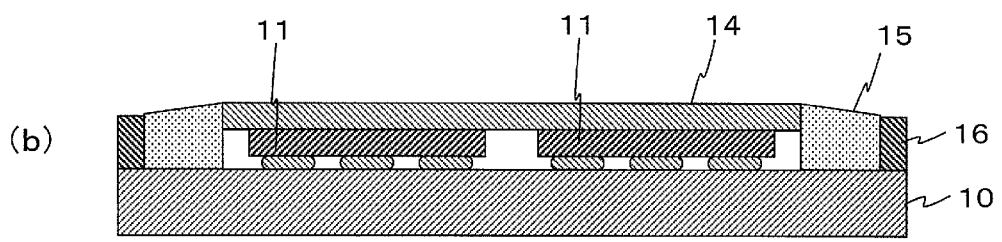
Figure 8:
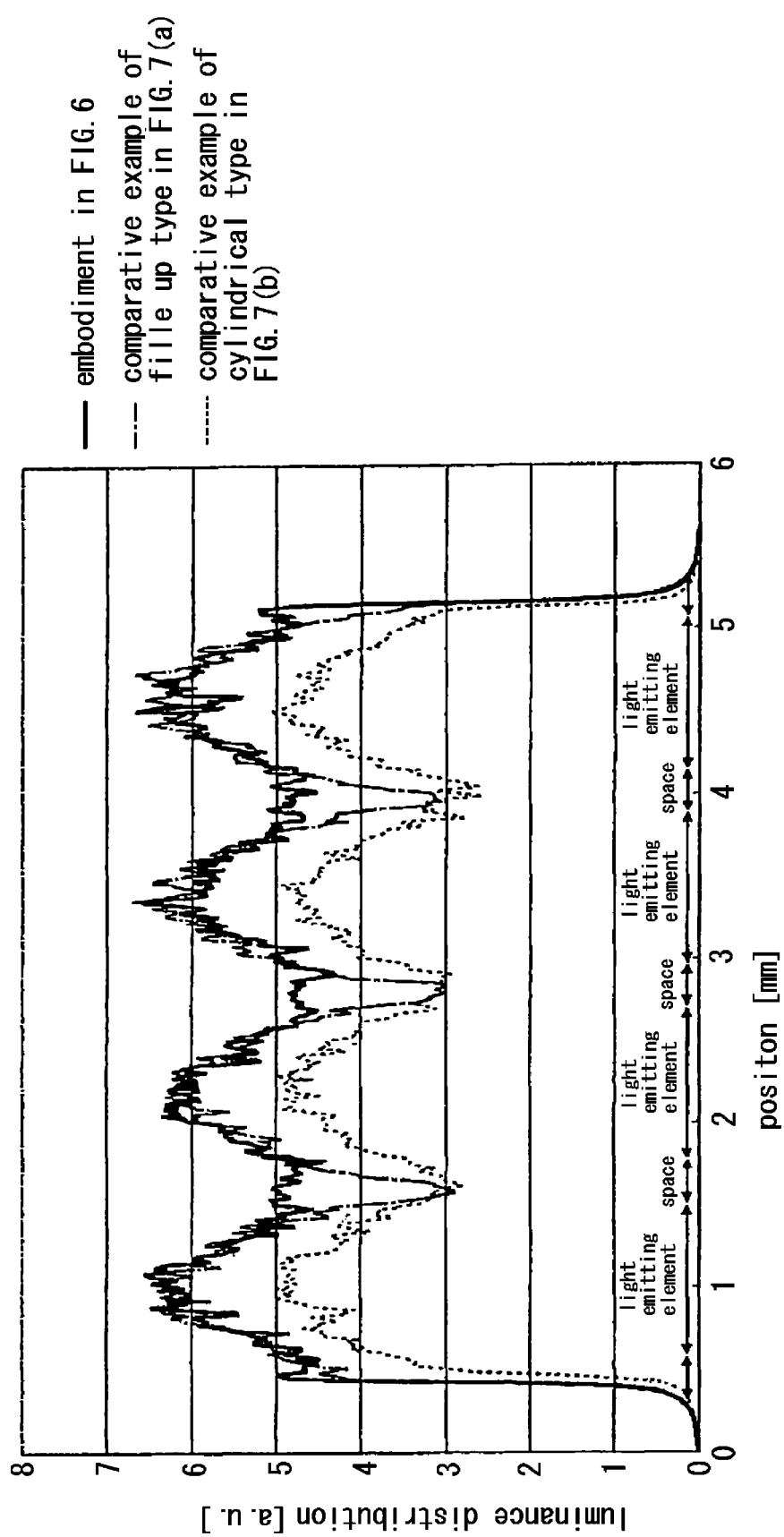
FIG. 8 is a graph showing upper surface luminance distributions of the light emitting device of the embodiment shown in FIG. 6, (b) and those shown in FIGS. 7 (a) and (b) as comparative examples (the number of light emitting elements is four).

Specifically, when luminance distributions in the upper surfaces of a light emitting device having the structure shown in FIG. 6, (b), and light emitting devices of the structures shown in FIGS. 7, (a) and (b) as comparative examples were measured, such results as shown in FIG. 8 were obtained. Although two of the light emitting elements 11 are shown in each of FIG. 6 (b) and FIGS. 7, (a) and (b), the light emitting devices used for the measurement had a configuration that four of light emitting elements were disposed in one line.

As clearly demonstrated with the results shown in FIG. 8, it can be seen that reduction of luminance in the regions between a plurality of light emitting elements 11 in the light emitting device of this embodiment shown in FIG. 6, (b) was clearly lower than those observed in the light emitting devices shown in FIGS. 7, (a) and (b), and unevenness of luminance was reduced.

In such a structure as shown in FIG. 7, (a) in which the slope 130 is not formed, and the circumferential spaces of the light emitting element 11 including the space under the bottom surface of the light emitting element 11 are filled with the reflection material layer 15, although the same luminance as that of the light emitting device of this embodiment shown in FIG. 6, (b) could be obtained in the center part of the light emitting element, the luminance was markedly lowered in the regions between the light emitting elements 11. Further, when the reflection material layer 15 having a vertical end surface at a position distant from the side of the light emitting element 11 was formed as shown in FIG. 7, (b), the luminance was low both in the center part of the light emitting element 11 and regions between the light emitting elements 11.

As described above, it was confirmed that the light emitting device of this embodiment shows high luminance for the upward direction of the light emitting element, small reduction of luminance in the regions between the light emitting elements, and small unevenness of luminance.

Although Embodiments 1 and 2 mentioned above were explained with reference to examples in which the blue light (short wavelength) emitted from the light emitting element was converted into light having a longer wavelength (fluorescence) in the tabular member 14 in the shape of a plate, the configuration is not limited to such a configuration, and there can be employed a configuration utilizing a multi-layer structure or a plurality of wavelength conversion materials in the tabular member 14 so that the light can be converted into lights of a plurality of wavelengths.

Further, the tabular member 14 may not aim at conversion of wavelength, but may be an optical layer transparent or translucent for the wavelength of the light emitting element. Furthermore, the back and front surfaces of the tabular member 14 are not limited to flat surfaces, and they may be processed into a structure for light extraction, or a structure as an optical lens.

In the configuration of Embodiment 2, the reflection material layer 15 may not be disposed. Also in this case, light can be reflected at the interface of the resin layer 13 and air, and therefore the same effect for reflecting the light as that of Embodiment 2 can be obtained.

EMBODIMENT 3

Figure 9:
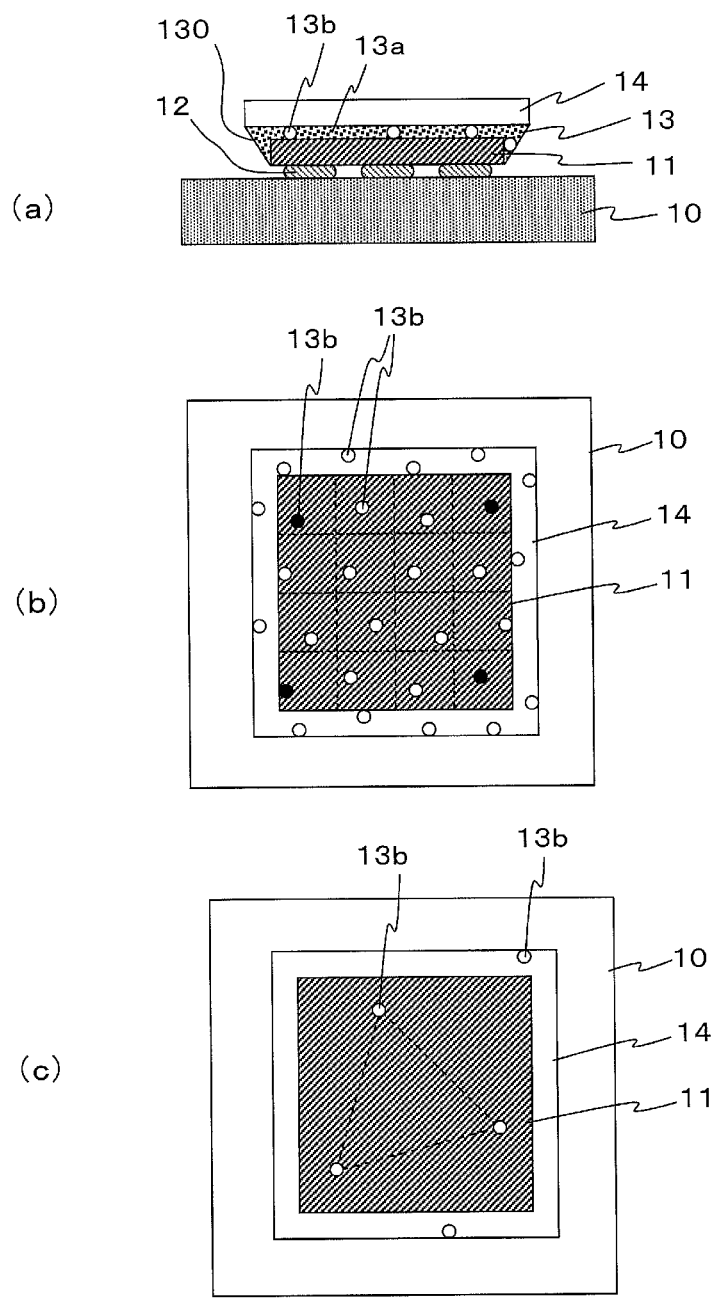
FIG. 9, (a) is a sectional view of a light emitting device according to Embodiment 3, and FIGS. 9, (b) and (c) are explanatory drawings schematically showing disposition of the spacer 13b when the light emitting device according to Embodiment 3 is seen from above.

A sectional view of a light emitting device according to Embodiment 3 is shown in FIG. 9, (a), and top views of the same are shown in FIG. 9, (b) and (c). As shown in FIG. 9, (a), on the submount substrate 10 on which upper surface wiring is formed, the flip chip type light emitting element 11 is mounted by bonding with a plurality of bumps 12. On the upper surface of the light emitting element 11, the resin layer 13 having a wavelength conversion function is disposed, and a transparent tabular member 14 is disposed on the resin layer 13.

In the base material of the resin layer 13, fluorescent substance particles 13a are dispersed at a high concentration, and a spacer 13b is further dispersed. As the base material, a material transparent for the light emitted by the light emitting element 11 and fluorescence emitted by the fluorescent substance particles 13a excited with the light emitted by the light emitting element 11 is used. As the base material, a transparent resin is used as in Embodiment 1. For example, such a transparent resin as a silicone resin and an epoxy resin can be used. A filler and a dye may also be dispersed in the base material, so long as they have a particle size smaller than that of the spacer 13b.

The spacer 13b contained in the resin layer 13 locates between the light emitting element 11 and the tabular member 14 to define the interval between the upper surface of the light emitting element 11 and the tabular member 14, and thereby define (determine) the thickness of the resin layer 13. The spacer 13b may be one having a particle-like shape of a desired particle size determined according to the thickness of the resin layer 13 to be formed, and the shape may be a polyhedral shape or a spherical shape. For example, the spacer 13b having a particle size not smaller than 10 μm and not larger than 100 μm can be preferably used. The spacer 13b having such a particle size has a particle size one digit or more larger than the wavelength of visible light emitted by the light emitting element 11, and therefore hardly shows an action of scattering the light.

The upper and lower ends of the spacer 13b may directly contact with the tabular member 14 and the light emitting element 11, respectively, or a base material constituting the resin layer 13 may be inserted between the spacer 13b and the tabular member and between the spacer 13b and the upper surface of the light emitting element 11. This is because, depending on the viscosity of the base material before curing or wettability of the surface of the spacer 13b with respect to the base material, affinity is generated between the surface of the spacer 13b and the base material, and the base material may enter between the spacer 13b and the tabular member. Since the affinity of the base material with respect to the spacer 13b is determined under the same condition for all the particles of the spacer 13b, the spacer 13b shows the function of defining the thickness of the resin layer 13 in any case.

The material of the spacer 13b may be an inorganic material such as glass or an organic material such as a resin, so long as a predetermined particle size can be highly precisely realized. The spacer 13b is desirably translucent or transparent for the light emitted by the light emitting element 11 and the fluorescence of the fluorescent substance, and one transparent for them can be used.

It is preferred that the spacer 13b and a filler contained in the resin layer 13 have an alkali metal oxide content of 0.2% by weight or lower, particularly preferably 0.1% by weight or lower. Further, it is desirable that they consist of a material not showing photocatalytic property. For example, the spacer 13b and filler consisting of alkali-free glass or either one of $SiO_2$ and $Al_2O_3$ or a combination thereof is used. It is preferred that the alkali-free glass has an alkali metal oxide content of 0.2% by weight or lower, particularly preferably 0.1% by weight or lower. It is preferred that purities of $SiO_2$ and $Al_2O_3$ are 99.9% or higher. As for crystal structure of the spacer 13b and the filler, they may be an amorphous material, or a polycrystal or single crystal material may also be used for securing improved purity and reduced alkali metal oxide content.

In the spacer 13b, a fluorescent substance may be dispersed. As the fluorescent substance to be dispersed, those used for the fluorescent substance particles 13a may be used.

The spacer 13b is desirably disposed on the upper surface of the light emitting element 11 in a number of at least 3 as shown in FIG. 9, (c), in order to support the transparent tabular member 14 in parallel to the upper surface of the light emitting element 11. It is particularly desirable to dispose one particle of the spacer 13b at each of four corners of the light emitting element 11 as shown with black circles in FIG. 9, (b).

Since the spacer 13b has a large particle size, it does not exhibit an action of changing relative positions of the particles thereof by attraction or repulsion between the particles, and the particles are spread on the light emitting element 11 with maintaining the dispersion state obtained at the time of being kneaded in the base material and the fluorescent substance particles 13a. Therefore, in order to dispose one particle at a position near each of the four corners on the upper surface of the light emitting element 11 as shown with black circles in FIG. 9, (b), the spacer 13b is added to the base material and the fluorescent substance particles 13a in such an amount that the particles of the spacer 13b are dispersed with intervals equal to the distances between centers of adjacent two of virtual square regions among those obtained by horizontally and vertically dividing the upper surface of the light emitting element 11 as shown in FIG. 9, (b), and kneaded to be dispersed in them. If this kneaded material is spread on the upper surface of the light emitting element 11 by application or printing, one particle of the spacer 13b is disposed in every one region of the virtual square in view of probability, and therefore the spacer 13b can be highly probably disposed in the square regions of the four corners of the upper surface of the light emitting element 11.

As the fluorescent substance particles 13a, those having a particle size smaller than that of the spacer 13b are used. Specifically, although it is sufficient that the particle size is just slightly smaller than that of the spacer 13b, those having a particle size smaller than that of the spacer 13b by 10% or more are preferred. For the fluorescent substance particles 13a, a fluorescent substance that is excited with light emitted by the light emitting element 11 to emit fluorescence of a desired wavelength is used. For example, when a light emitting device that emits white light is constituted, the light emitting element 11 that emits blue light and a fluorescent substance that emits yellow fluorescence using blue light as the excitation light (for example, YAG fluorescent substance) can be used.

The tabular member 14 may be a member that has a flat lower surface and can form the resin layer 13 having a constant thickness between the lower surface and the upper surface of the light emitting element 11, when the lower surface thereof is supported by the spacer 13b. It is sufficient that the flat lower surface of the tabular member 14 is macroscopically flat, and microscopic fine unevenness for diffusion, distribution etc. of light may be formed. When unevenness is formed, size of unevenness is preferably 5 μm or less in order not to affect the action of the spacer 13b or the fluorescent substance particles. Further, it is also possible to provide unevenness for the light diffusion and distribution on the side of the upper surface of the tabular member 14.

Further, the tabular member 14 preferably has an alkali metal oxide content of 0.2% by weight or lower, particularly preferably 0.1% by weight or lower. Further, it is preferred that the tabular member 14 does not show photocatalytic property.

Since the upper surface of the tabular member 14 serves as a light extraction surface, it may be subjected to a surface treatment in order to improve the light extraction efficiency. Further, the upper surface of the tabular member 14 may not necessarily need to be a flat surface, and it may be processed into a shape for scattering, condensing or distributing light, for example, an uneven shape or lens shape.

In the explanation of this embodiment, although the tabular member 14 transparent to the light emitted by the light emitting element 11 and the fluorescence emitted by the fluorescent substance particles 13a is used, it may have desired optical characteristics. For example, it is also possible to use a plate-shaped filter that cuts light of a predetermined wavelength as the tabular member 14. Further, it is also possible to use a fluorescent glass plate containing a fluorescent substance component that converts the light from the light emitting element 11 into light of a desired wavelength, or a fluorescent ceramic plate formed by sintering of a raw material of fluorescent substance (for example, YAG plate).

As the submount substrate 10, for example, a substrate made from AlN ceramics on which a wiring pattern is formed with Au or the like is used. As the bump 12, for example, Au bump is used.

According to this embodiment, the resin layer 13 can be thinly formed in a predetermined thickness with sufficient accuracy, because the spacer 13b is disposed. Therefore, the fluorescent substance particles 13a can be contained in the base material of the resin layer 13 at a high concentration, which markedly improves the conversion efficiency. For example, the concentration of the fluorescent substance particles 13a contained in the base material of the resin layer 13 can be 13 to 90% by weight, the thickness of the resin layer 13 can be 200 to 30 μm, and variation of the thickness can be 10% or less. Although the concentration of the fluorescent substance particles 13a may be 13% by weight or higher, it is preferably 30% by weight or higher, more preferably 50% by weight or higher.

By using the tabular member 14, the spacer 13b or filler of the resin layer 13a having an alkali metal oxide content of 0.2% by weight or lower, oil bleeding from the base resin of the resin layer 13 (silicone resin, epoxy resin, etc.) due to an alkali metal oxide contained in the tabular member 14 or the filler can be prevented. That is, the oil bleeding, which is a phenomenon that the base material resin of the resin layer 13 is partially decomposed with an alkali component contained in the filler into lower molecules to generate oily substances, and these substances bleed from the resin layer 13, can be prevented. Such phenomena as unevenness of the interface between the resin layer 13 and the tabular member 14 to be generated by the oil that bled, or degradation of the optical characteristics to be induced by oil that creeps up the surface of the tabular member 14 can be thereby prevented.

Figure 10:
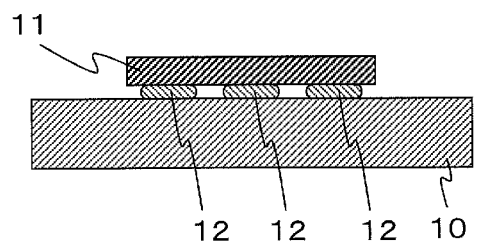
FIGS. 10, (a) to (c) are explanatory drawings showing the production process of the light emitting device according to Embodiment 3.
Figure 10:
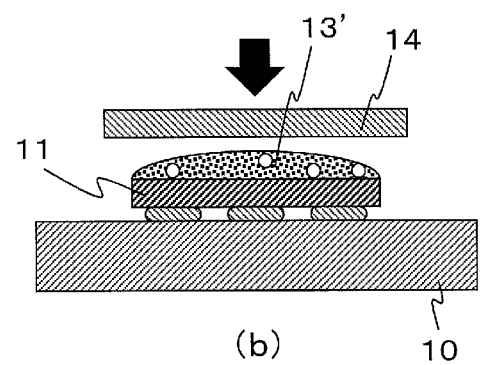
Figure 10:
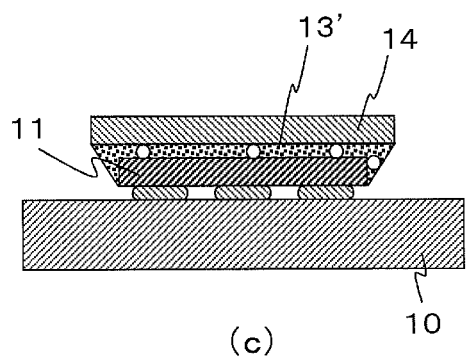

Hereafter, the method for producing the light emitting device of this embodiment will be explained with reference to FIG. 10, (a) to (c). First, as shown in FIG. 10, (a), element electrodes of the light emitting element 11 of the flip chip type are bonded to the wiring pattern on the upper surface of the submount substrate 10 by using the bumps 12 to mount the element on the substrate. An uncured base material of the resin layer 13 is prepared, and the fluorescent substance particles 13a and the spacer 13b are added at predetermined concentrations, and sufficiently kneaded to uniformly disperse them in the base material and thereby obtain an uncured paste 13'. As shown in FIG. 10, (b), this paste 13' is applied (or dropped) to the upper surface of the light emitting element 11 in a predetermined amount, and the tabular member 14 of a size slightly larger than the upper surface of the light emitting element 11 is disposed. The own weight of the tabular member 14 and, if needed, a further load are applied to the upper surface of the tabular member 14, so that the tabular member 14 is supported above the upper surface of the light emitting element 11 by the spacer 13b contained in the paste 13', and the interval between the upper surface of the light emitting element 11 and the tabular member 14 is determined by the spacer 13b.

As a result, a layer of the paste 13' having a layer thickness corresponding to the particle size of the spacer 13b or sum of the particle size of the spacer 13b and thickness of the base material layer covering circumference of the spacer 13b is formed with the uncured paste 13' as shown in FIG. 10, (c). In this step, the paste 13' covers at least a part of the side of the light emitting element 11, and is maintained between the light emitting element and the tabular member by surface tension, and thus the slope 130 connecting the side of the light emitting element 11 and the lower surface of the tabular member 14 is formed.

The paste 13' is cured by a predetermined curing treatment to form the resin layer 13. As a result, the light emitting device shown in FIG. 9, (a) is completed. In addition, so long as the shape of the resin layer 13 does not change in the following steps, it may not be completely cured, but may be cured under a condition for semi-curing the paste.

The functions of the parts of the light emitting device having such a configuration as described above will be explained. The light emitted upward by the light emitting element 11 enters into the resin layer 13, and a part of it is converted into light of a predetermined wavelength by the fluorescent substance, mixed with the light that is not converted by the fluorescent substance, and emitted from the upper surface of the tabular member 14. The light emitted from the side of the light emitting element 11 enters into the resin layer 13, and a part of it is converted into light of a predetermined wavelength by the fluorescent substance, and emitted to the outside from the slope 130 of the wavelength conversion layer, or reflected upward by the slope 130 and emitted from the upper surface of the tabular member 14.

Since a higher concentration of the fluorescent substance particles 13a can be used in the resin layer 13, the conversion efficiency can be markedly improved. Since the thickness of the resin layer 13 is highly accurately determined by the spacer 13b to be a thickness suitable for the concentration of the fluorescent substance particles 13a, the thickness is uniform and shows little variation among products. Therefore, there can be provided a light emitting device showing little color unevenness in a single product and little color variation among products.

Figure 11:
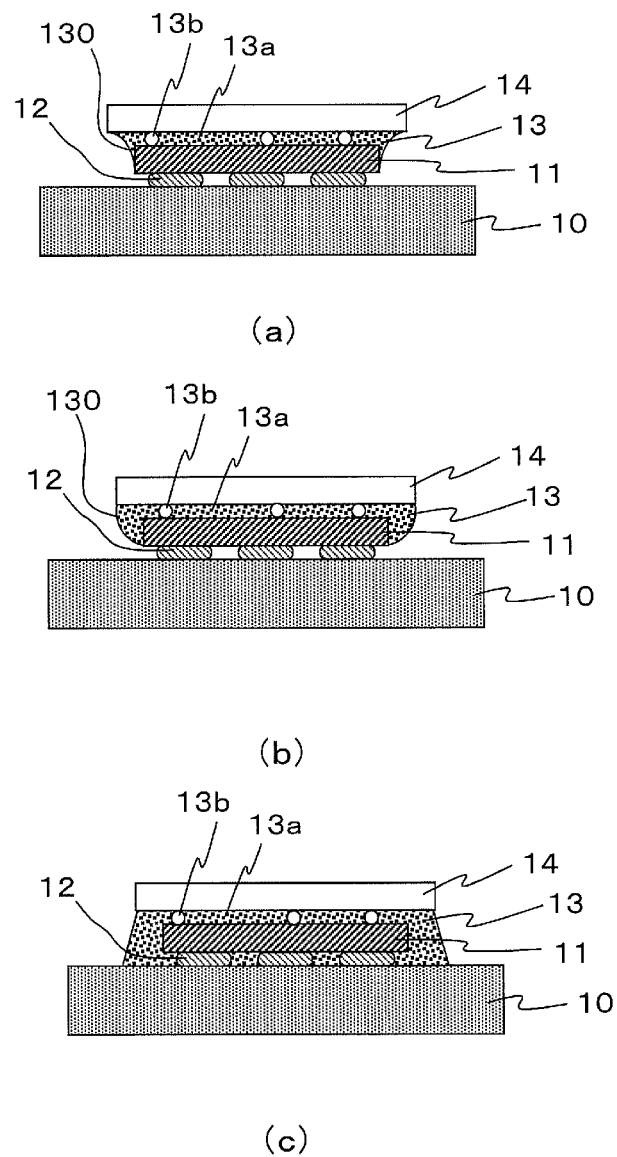
FIG. 11, (a) to (c) are sectional views showing variations of the structure of the resin layer 13 of the light emitting device according to Embodiment 3.

The above embodiment was explained with reference to the example in which the side of the resin layer 13 forms the slope 130 utilizing surface tension, and the presently disclosed subject matter is not limited to the shape shown in this example. For example, the slope 130 may be in the form of a curved surface convex to the inside (side of the center of the light emitting element 11) as shown in FIG. 11, (a), or a curved surface convex to the outside as shown in FIG. 11, (b). Furthermore, as shown in FIG. 11, (c), the slope may not be formed by utilizing surface tension, and the resin layer 13 may reach the upper surface of the submount substrate 10.

The shape of the side of the resin layer 13 can be controlled by the amount of the paste 13' applied (or dropped) in the step shown in FIG. 10, (b) during the production. If the amount of the paste 13' is small, the slope 130 is formed in the shape of a curved surface convex to the inside as shown in FIG. 11, (a), if the amount of the paste 13' is increased, the slope 130 in the shape of a flat surface is formed as shown in FIG. 9, (a), and if the amount of the paste 13' is further increased, the slope 130 is formed in the shape of a curved surface convex to the outside as shown in FIG. 11, (b). If the amount of the paste 13' is increased in such a degree that it cannot be maintained between the light emitting element and the tabular member and on a side of the light emitting element by surface tension, the resin layer 13 reaches the upper surface of the submount substrate 10 as shown in FIG. 11, (c).

EMBODIMENT 4

Figure 12:
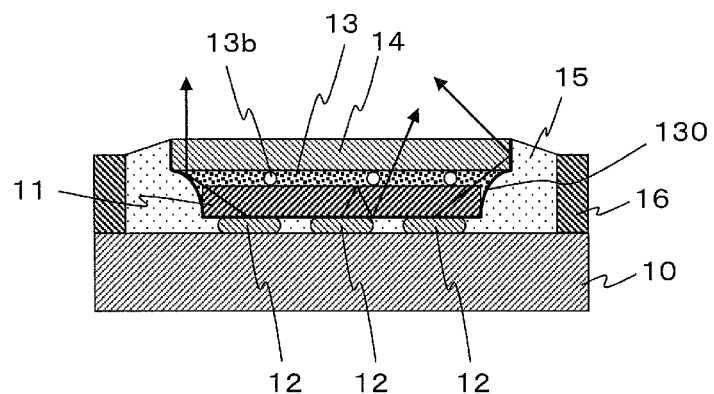
FIG. 12 is a sectional view of a light emitting device according to Embodiment 4.

A sectional view of a light emitting device according to Embodiment 4 is shown in FIG. 12. This light emitting device has a configuration that the space under the lower surface of the light emitting element 11, which is present in the light emitting device according to Embodiment 3 shown in FIG. 11, is filled with the reflection material layer 15 in order to further improve the light extraction efficiency. Further, the reflection material layer 15 also covers the sides of the light emitting element 11, the resin layer 13, and the tabular member 14.

Specifically, the frame 16 is disposed outside the light emitting element 11, and the space between the light emitting element 11 and the frame 16 is filled with the reflection material layer 15. For the reflection material layer 15, a non-conductive material showing a high reflection rate is used. The reflection material layer 15 covers outer circumferences of sides of the light emitting element 11, the resin layer 13, and the tabular member 14. The reflection material layer 15 also fills the space between the bottom surface of the light emitting element 11 and the upper surface of the substrate 10 so as to fill the spaces between the bumps 12.

As the reflection material layer 15, for example, a resin in which a reflective filler such as those of titanium oxide or zinc oxide is dispersed is used. It is also desirable to use, as the titanium oxide or zinc oxide filler, a filler having an alkali metal oxide content of 0.2% by weight or lower, and a structure not showing photocatalytic property. This is for not inducing oil bleeding from the resin.

For the frame 16, for example, a ceramic ring is used.

In the light emitting device of such a configuration as described above, of the light emitted by the light emitting element 11, the light emitted upward enters into the resin layer 13, subjected to wavelength conversion, and emitted upward from the tabular member 14, as shown in FIG. 12, similarly to the light emitting device of Embodiment 3.

The light emitted to the side of the lower surface of the light emitting element 11 is reflected upward by the reflection material layer 15 filled in the space between the bottom surface of the light emitting element 11 and the upper surface of the base material 10. Accordingly, decay of the light induced by repetitive reflections between the bottom surface of the light emitting element 11 and the upper surface of the substrate 10 can be prevented, and therefore the light extraction efficiency for the upward direction can be improved.

The light emitted from the side of the light emitting element 11 enters into the resin layer 13 from the side, and a part thereof is subjected to wavelength conversion, and reflected by the slope 130 at the boundary between the reflection material layer 15 and the resin layer 13. Therefore, much of the light emitted from the side of the light emitting element 11 is not returned to the inside of the light emitting element 11, but goes upward, and therefore it is not absorbed by the light emitting element 11. Accordingly, the light propagating in the transverse direction can be efficiently extracted from the upper part, and therefore the light extraction efficiency can be improved.

Further, since the reflection material layer 15 is in contact with the side of the tabular member 14, the area of the opening (light emitting surface) of the reflection material layer 15 is equal to the area of the tabular member 14, and thus a light source having a small light emitting area can be provided.

Although an example in which the slope 130 at the boundary between the reflection material layer 15 and the resin layer 13 is in the shape of a curved surface convex to the inside is shown in FIG. 12, the shape of the slope 130 is not limited to this shape, and it may be a slope in the shape of a flat surface as shown in FIG. 9, (a), or in the shape of a curved surface convex to the outside (side of the frame 16) as shown in FIG. 11, (b). The slope 130 can be in the shape of a curved surface convex to the inside as shown in FIG. 12 having a curvature of 5 or smaller.

Further, the lower end of the slope 130 does not necessarily need to be in the same height as the bottom surface of the light emitting element 11 as shown in FIG. 12, (a), FIG. 9, (a), and FIG. 11, (b), and may be at a height within the side of the light emitting element 11. If the upper end of the slope 130 locates at a position on the side of the substrate 10 with respect to the upper surface of the light emitting element 11 at least, it can serve as the slope 130 that reflects light emitted from the side of the light emitting element 11. Further, the light emitting element 11 can be flip chip mounted on the substrate 10. This is because, if it is flip chip mounted, the light emitting surface locates at a position near the bottom surface of the light emitting element, and therefore reflection by the slope 130 can be utilized at maximum.

The method for producing the light emitting device according to Embodiment 4 is the same as that for Embodiment 3.

EMBODIMENT 5

As Embodiment 5, a light emitting device in which a plurality of light emitting elements 11 are mounted on one submount substrate 10 will be explained. Sectional views of light emitting devices according to Embodiment 5 are shown in FIGS. 13, (a), (b), and (c).

A plurality of the light emitting elements 11 are mounted so that all of them are covered with one tabular member 14. The intervals between the plurality of the light emitting elements 11 and the tabular member 14 are defined by the spacer 13b locating between them. Between the light emitting element 11 and the tabular member 14, a thin resin layer 13 is formed.

Because of errors at the time of mounting a plurality of the light emitting elements 11 on the submount substrate 10 or the like, the heights of the upper surfaces of the plurality of the light emitting elements 11 may not be the same. In such a case, if one tabular member 14 is mounted on all of the plurality of the light emitting elements 11, the tabular member 14 is supported by the spacer 13b on the light emitting element 11 having the highest upper surface, thus the spacer 13b on the light emitting elements 11 of which upper surfaces are lower than the above does not contribute to determination of the thickness of the resin layer 13, and there may be provided a structure where the base material layer of a large thickness and the fluorescent substance particles 13a are inserted between the spacer 13b and the tabular member 14, but such a structure is acceptable. This is because, in such a case, only the spacer 13b on the light emitting element 11 having the highest upper surface functions as a spacer, and the spacer 13b of the light emitting elements 11 having a low upper surface does not function as a spacer, but variation of the thickness of the resin layer 13 can be made to be within a predetermined range, if the variation of the heights of the light emitting elements 11 is within an acceptable error range.

Figure 13:
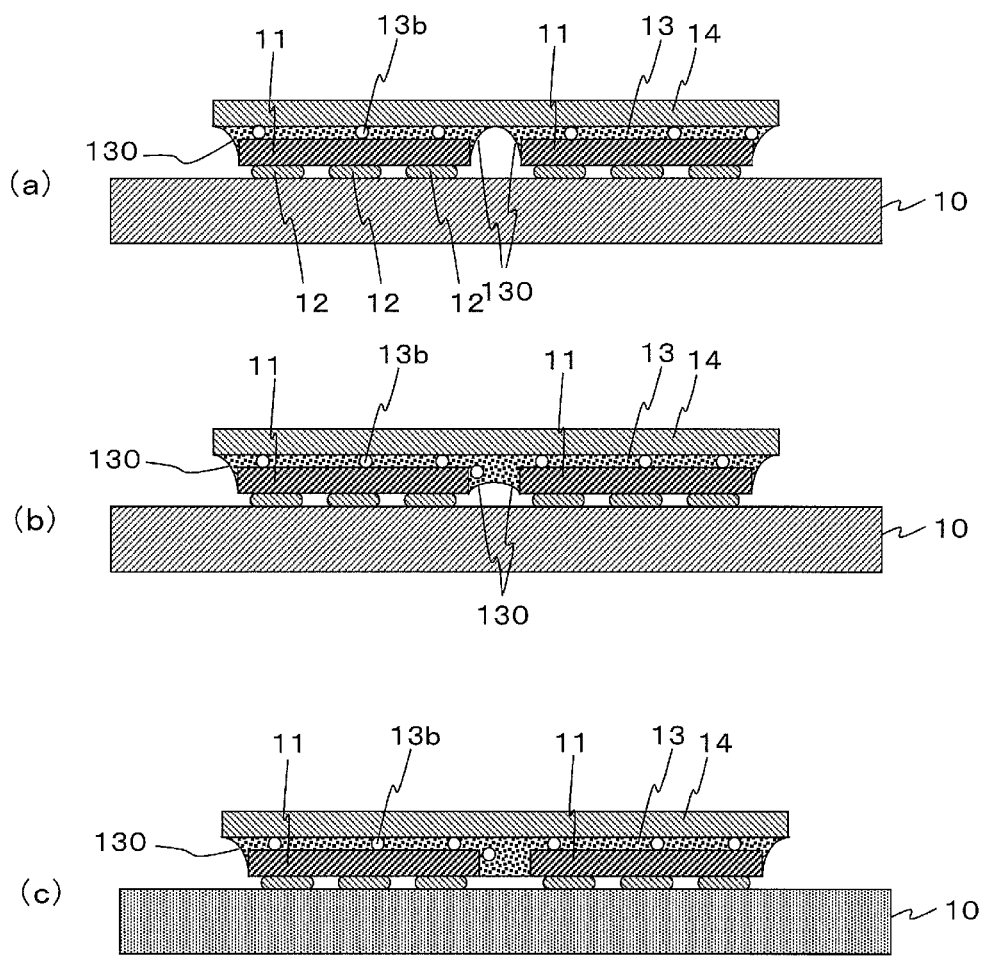
FIGS. 13, (a) to (c) are sectional views showing various shapes of the light emitting devices carrying a plurality of light emitting elements according to Embodiment 5.

The slope 130 of the outer periphery of the resin layer 13 can be a curved surface convex to the inside as shown in FIG. 13, (a) to (c), or a slope linearly connecting the bottom surface of the light emitting element 11 and the lower surface of the tabular member 14 as shown in the or FIG. 9, (a). Further, it is also possible to use a curved surface convex to the outside as shown in FIG. 11, (b).

The side of the resin layer 13 between a plurality of the light emitting elements 11 can also form the slope 130 as shown in FIG. 13, (a) and (b). The slope of the resin layer 13 between a plurality of light emitting elements 11 can have a shape that does not reach the tabular member 14 as shown in FIG. 13, (b). It may also reach the tabular member 14 as shown in FIG. 13, (a).

The methods for producing the light emitting devices shown in FIG. 13, (a) to (c) are similar to that shown in FIG. 10, (a) to (e) for Embodiment 3. In the case of the configuration shown in FIG. 13, (a), an equal amount of the paste 13' is applied to each light emitting element 11, a region on the tabular member 14 to be overlapped with each light emitting element 11, or both of these to form the slope 130 of the resin layer 13 in a desired shape on each light emitting element 11. In such a case where the resin layers 13 above adjacent light emitting elements 11 are connected in the region between the adjacent light emitting elements 11 as shown in FIGS. 13, (b) and (c), the amount of the paste 13' to be applied to each light emitting element 11 may be changed so that the total application amount of the paste 13' becomes a predetermined amount.

The light emitting device according to Embodiment 5 can improve the light extraction efficiency for the upper surface direction in spite of the configuration that a plurality of the light emitting elements 11 are mounted. Furthermore, by forming the slope 130 in the regions between a plurality of the light emitting elements 11 as shown in FIGS. 13, (a) and (b), light can be reflected upward in the regions between the plurality of the light emitting elements 11, and therefore reduction of luminance in the regions between the plurality of the light emitting elements 11, which results in unevenness of luminance in the light emitting surface, can be prevented.

In addition, it is also possible to dispose the reflection material layer 15 outside the configurations according to Embodiment 5 shown in FIGS. 13 (a), (b), and (c), as shown in FIG. 12. In such a case, in the configurations shown in FIGS. 13, (a) and (b), it is desirable that the reflection material layer 15 is filled so that it contacts with the slope 130 also in the regions between a plurality of the light emitting elements 11.

EXAMPLES

Example 1

As Example 1, a light emitting device having the structure shown in FIG. 12 was produced. There was prepared a submount substrate 10 on which a flip chip type light emitting element 11 in the shape of a 1-mm square having a thickness of 100 μm was mounted. To a silicone resin, 60% by weight of a YAG fluorescent substance having a particle size of 15 μm as the fluorescent substance particles 13a, and 5% by weight of silica glass spherical beads (mean particle size: 40±4 μm, CV value: ±3.5%, purity of $SiO_2$: 99.9%, produced by Ube-Nitto Kasei Co., Ltd.) as the spacer 13b were added, and they were sufficiently kneaded to attain uniform dispersion and thereby obtain a paste 13'.

About $7.0 \times 10^{-4}$ ml of the above paste 13' was applied on the upper surface of the light emitting element 11 as the paste 13'. A tabular member 14 of alkali-free glass in the shape of a 1.2 mm-square having a thickness of 0.1 mm (alkali metal oxide content: not higher than 0.1% by weight, OA-10G, produced by Nippon Electric Glass Co., Ltd.) was mounted thereon. By the own weight of the tabular member 14, the paste 13' was spread in the space between the upper surface of the light emitting element 11 and the plate glass, and there was obtained a state that the tabular member 14 was supported by the glass beads (spacer 13a) above the light emitting element 11. A thin layer of the paste 13' (uncured resin layer 13) containing the fluorescent substance particles 13a at a high concentration was thereby formed. The thickness of this layer was defined by the interval between the tabular member 14 and the light emitting element 11, between which the spacer 13b was retained.

In order to cure the silicone resin of the resin layer 13, heating was performed at 150° C. for 4 hours. Then, a silicone resin in which a $TiO_2$ filler was dispersed was filled as the reflection material in the ring frame 16, heated at 150° C. for 4 hours and thereby cured to form the reflection material layer 15. The light emitting device having the shape shown in FIG. 12 was thereby produced.

Example 2

As Example 2, a light emitting device was produced in the same manner as that used in Example 1, except that the spacer 13b was changed to spherical beads consisting of titanium barium glass (median particle size: 41±2 μm, particle size variation: ±3 μm, alkali metal oxide content: lower than 0.2% by weight, containing $TiO_2$, ZnO, BaO, $ZrO_2$, CaO, and $SiO_2$, GS40S, Nippon Electric Glass Co., Ltd.), and the material of the tabular member 14 was changed to alkali-free glass (alkali metal oxide content: not higher than 0.2% by weight, AF45, produced by SCHOTT Nippon K.K.).

Example 3

As Example 3, a light emitting device was produced in the same manner as that used in Example 1, except that the spacer 13b was changed to spherical beads consisting of titanium barium glass (median particle size: 41±2 μm, particle size variation: ±3 μm, alkali metal oxide content: lower than 0.2% by weight, containing $TiO_2$, ZnO, BaO, $ZrO_2$, CaO, and $SiO_2$, GS40S, Nippon Electric Glass Co., Ltd.).

Comparative Example 1

As Comparative Example 1, a light emitting device of Comparative Example 1 was produced in the same manner as that used in Example 1, except that the spacer 13b was changed to spherical beads consisting of titanium barium glass (median particle size: 41±2 μm, particle size variation: ±3 μm, alkali metal oxide content: lower than 0.2% by weight, containing $TiO_2$, ZnO, BaO, $ZrO_2$, CaO, and $SiO_2$, GS40S, Nippon Electric Glass Co., Ltd.), and the material of the tabular member 14 was changed to low alkali glass ($Na_2O$ elution amount: about 20 μg/g, which corresponds to an alkali metal oxide content higher than 0.2% by weight, D263, produced by SCHOTT Nippon K.K.).

<Evaluation>

The light emitting devices of Examples 1, 2 and 3 and Comparative Example 1 were placed in a constant temperature environment of 130° C., the light emitting elements were turned on by supplying electric currents to attain such an environment that the junction temperature of the light emitting elements became about 180° C., and presence or absence of oil bleeding was visually confirmed after 100 hours.

As a result, the light emitting devices of Examples 1, 2 and 3 showed less oil bleeding compared with the light emitting device of Comparative Example 1. It was considered that this was because the low alkali glass having an alkali metal oxide content higher than 0.2% by weight was used as the tabular member 14 in Comparative Example 1, therefore the silicone resin of the resin layer 13 was hydrolyzed and decomposed into low molecules by cleavage of siloxane bonds, and the decomposition products were bled as oil.

Further, the light emitting device of Example 1 showed less oil bleeding compared with the light emitting devices of Examples 2 and 3. Further, the light emitting devices of Examples 2 and 3 showed oil bleeding at equivalent levels. It was considered that this was because titanium barium glass was used as the spacer 13b in Examples 2 and 3, therefore the spacer 13b contained $TiO_2$, BaO, $ZrO_2$, ZnO, CaO, and $SiO_2$, thus the silicone resin of the resin layer 13 was hydrolyzed and decomposed into low molecules by the photocatalytic action of $TiO_2$ and ZnO, and the decomposition products were bled as oil, whereas the spacer 13b of silica was used in Example 1, and therefore bleeding of the silicone resin was not generated.

DESCRIPTION OF NUMERICAL NOTATIONS

10 . . . Submount substrate, 11 . . . light emitting element, 12 . . . bump, 13 . . . resin layer, 14 . . . tabular member, 15 . . . reflection material layer, 16 . . . outer frame, 81 . . . convex, 130 . . . slope

The invention claimed is:

1. A light emitting device comprising a substrate, a light emitting element mounted on the substrate, a resin layer disposed on the light emitting element and comprising a resin through which light emitted by the light emitting element can penetrate as a base material, and a tabular member disposed on the resin layer, wherein:

the resin layer contains fluorescent substance particles and spacer particles having a particle size larger than that of the fluorescent substance particles and locating between the light emitting element and the tabular member to define thickness of the resin layer, and the spacer particles are constituted with a material having an alkali metal oxide content of 0.2% by weight or lower.

2. A light emitting device comprising a substrate, a plurality of light emitting elements mounted on the substrate in an array, a resin layer disposed on the light emitting elements and comprising a resin through which light emitted by the light emitting elements can penetrate as a base material, and a tabular member disposed on the resin layer so as to cover the plurality of the light emitting elements as one body, wherein:

the resin layer contains fluorescent substance particles and spacer particles having a particle size larger than that of the fluorescent substance particles and locating between the light emitting elements and the tabular member to define thickness of the resin layer, and the spacer particles are constituted with a material having an alkali metal oxide content of 0.2% by weight or lower.

3. A method for producing the light emitting device according to claim 1, the method comprising:

dropping an uncured resin on either one or both of the light emitting element and the tabular member in such an amount that the resin is maintained on them by surface tension, and piling up the light emitting element and the tabular member with the uncured resin maintained between them by surface tension of the uncured resin to form an uncured resin layer having an inclined side between the light emitting element and the tabular member, and then curing the uncured resin layer, wherein:

the resin contains fluorescent substance particles and spacer particles having a particle size larger than that of the fluorescent substance particles and locating between the light emitting element and the tabular member to define thickness of the resin layer, and the spacer particles are constituted with a material having an alkali metal oxide content of 0.2% by weight or lower.

4. The light emitting device according to claim 1, wherein the material having an alkali metal oxide content of 0.2% by weight or lower is alkali-free glass or a material comprising at least one of $SiO_2$ and $Al_2O_3$ as a main component and having a purity of 99.9% or higher.

5. The light emitting device according to claim 1, wherein the tabular member contains a fluorescent substance.

6. The light emitting device according to claim 1, which further comprises a reflection material layer disposed so as to closely contact with sides of the resin layer and the tabular member.

7. The light emitting device according to claim 1, wherein the tabular member is alkali-free glass or a material comprising at least one of $SiO_2$ and $Al_2O_3$ as a main component and having a purity of 99.9% or higher.

8. The light emitting device according to claim 2, wherein the tabular member is alkali-free glass or a material comprising at least one of $SiO_2$ and $Al_2O_3$ as a main component and having a purity of 99.9% or higher.

* * * * *